United States Patent
Hidaka et al.

(10) Patent No.: US 9,519,223 B2
(45) Date of Patent: Dec. 13, 2016

(54) SURFACE POSITION DETECTION APPARATUS, EXPOSURE APPARATUS, AND EXPOSURE METHOD

(71) Applicant: NIKON CORPORATION, Tokyo (JP)

(72) Inventors: Yasuhiro Hidaka, Kanagaya (JP); Tadashi Nagayama, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 14/712,504

(22) Filed: May 14, 2015

(65) Prior Publication Data

US 2015/0248064 A1  Sep. 3, 2015

Related U.S. Application Data

(63) Continuation of application No. 13/405,524, filed on Feb. 27, 2012, now Pat. No. 9,069,261, which is a (Continued)

(30) Foreign Application Priority Data

Jul. 8, 2005  (JP) ................. 2005-200178

(51) Int. Cl.
*G03B 27/72* (2006.01)
*G03B 27/54* (2006.01)
(Continued)

(52) U.S. Cl.
CPC ......... *G03F 7/70191* (2013.01); *G03F 9/7026* (2013.01); *G03F 9/7034* (2013.01);
(Continued)

(58) Field of Classification Search
CPC .............................. G03F 9/7026; G03F 9/7065
(Continued)

(56) References Cited

U.S. PATENT DOCUMENTS

| 4,864,123 A | 9/1989 | Mizutani et al. |
| 5,191,200 A * | 3/1993 | van der Werf ....... G02B 21/241 |
| | | 250/201.4 |

(Continued)

FOREIGN PATENT DOCUMENTS

| CN | 1517798 A | 8/2004 |
| JP | 06-097045 | 4/1984 |

(Continued)

OTHER PUBLICATIONS

Apr. 27, 2015 Office Action issued in Chinese Patent Application No. 201310662906.5.

(Continued)

*Primary Examiner* — Hung Henry Nguyen
(74) *Attorney, Agent, or Firm* — Oliff PLC

(57) ABSTRACT

A surface position detection apparatus capable of highly precisely detecting the surface position of a surface to be detected without substantially being affected by relative positional displacement due to a polarization component occurring in a light flux having passed through a reflective surface. In the apparatus, a projection system has a projection side prism member having first reflective surfaces, and a light receiving system has a light receiving prism member having second reflective surfaces arranged in correspondence with the projection side prism member. The surface position detection apparatus further has a member for compensating relative positional displacement due to a polarization component of a light flux having passed through the first and second reflective surfaces.

25 Claims, 8 Drawing Sheets

Related U.S. Application Data continuation of application No. 11/988,239, filed as application No. PCT/JP2006/312852 on Jun. 28, 2006, now Pat. No. 8,149,382.

(51) Int. Cl.
 *G03F 7/20* (2006.01)
 *G03F 9/00* (2006.01)

(52) U.S. Cl.
 CPC .......... *G03F 9/7065* (2013.01); *G03F 9/7088* (2013.01); *Y10T 29/49124* (2015.01)

(58) Field of Classification Search
 USPC ........................................ 355/52, 53, 67–71
 See application file for complete search history.

(56) References Cited

U.S. PATENT DOCUMENTS

| | | | |
|---|---|---|---|
| 5,633,721 A | 5/1997 | Mizutani | |
| 5,638,207 A | 6/1997 | Fukuzawa et al. | |
| 6,813,397 B2 | 11/2004 | Lin | |
| 6,897,462 B2 * | 5/2005 | Kawaguchi | G01N 21/9501 250/559.22 |
| 7,116,401 B2 | 10/2006 | Nijmeijer et al. | |
| 7,248,337 B2 | 7/2007 | Teunissen et al. | |
| 7,307,725 B2 | 12/2007 | Oomori et al. | |
| 7,646,471 B2 | 1/2010 | Teunissen et al. | |
| 2002/0000520 A1 | 1/2002 | Kawaguchi | |
| 2004/0165169 A1 | 8/2004 | Teunissen et al. | |
| 2005/0274909 A1 | 12/2005 | Teunissen et al. | |

FOREIGN PATENT DOCUMENTS

| | | |
|---|---|---|
| JP | S63-275912 A | 11/1988 |
| JP | H05-129182 A | 5/1993 |
| JP | H07-239212 A | 9/1995 |
| JP | H08-87724 A | 4/1996 |
| JP | H09-178415 A | 7/1997 |
| JP | H10-82611 A | 3/1998 |
| JP | H10-125572 A | 5/1998 |
| JP | 2001-296105 A | 10/2001 |
| JP | 2004-163555 A | 6/2004 |
| KR | 20080026121 A | 3/2008 |

OTHER PUBLICATIONS

Apr. 27, 2015 Office Action issued in Chinese Patent Application No. 201310661731.6.
Office Action mailed Aug. 19, 2014 issued in Japanese Patent Application No. 2013-214932.
Nov. 2, 2014 Office Action issued in Chinese Patent Application No. 200680024570.8.
Japanese Office Action dated Jul. 19, 2011 for Japanese Patent Application No. 2007-524561.
Japanese Office Action dated Jul. 19, 2011 for Japanese Patent Application No. 2008-180029.
Japanese Office Action dated Jul. 19, 2011 for Japanese Patent Application No. 2008-180030.
Aug. 3, 2012 European Search Report issued in counterpart European Patent Application No. 12150443.5.
Jul. 31, 2012 Office Action issued in counterpart Korean Patent Application No. 10-2007-7030352.
Jul. 31, 2012 Office Action issued in counterpart European Patent Application No. 06767469.7.
Aug. 20, 2013 Office Action issued in European Patent Application No. 12150443.5.
Aug. 23, 2013 Search Report issued in European Patent Application No. 12150436.9.
Aug. 13, 2013 Office Action issued in Japanese Patent Application No. 2011-205343.
Jan. 7, 2013 Office Action issued in Chinese Patent Application No. 200680024570.8.
May 13, 2013 Office Action issued in European Patent Application No. 12150442.7.
International Search Report mailed Aug. 15, 2006, for application No. PCT/JP2006/312852.
English translation of International Preliminary Report on Patentability issued Jan. 10, 2008, for application No. PCT/JP2006/312852.
European Search Opinion dated Sep. 16, 2009 for European application No. 06767469.7.
English Translation of Chinese Office Action dated Dec. 4, 2009, for Chinese application No. 200680024570.8.
Office Action dispatched on Jul. 19, 2011 for Japanese Patent Application No. 2008-180029.
Office Action for European Patent Application No. 06767469.7-2222 dated Nov. 17, 2011.
Office Action issued in Chinese Application No. 200680024570.8 dated Aug. 3, 2012.
Aug. 3, 2012 Search Report issued in European Patent Application No. 12150442.7.
May 14, 2013 Office Action issued in Korean Patent Application No. 10-2013-7002685.
European Office Action dated Dec. 29, 2009 for European application No. 06767469.7.

* cited by examiner

SURFACE POSITION DETECTION APPARATUS, EXPOSURE APPARATUS, AND EXPOSURE METHOD

This application is a continuation of U.S. application Ser. No. 13/405,524, filed Feb. 27, 2012 and now U.S. Pat. No. 9,069,261 issued Jun. 30, 2015, which is a continuation of U.S. application Ser. No. 11/988,239, filed Jul. 15, 2008 and now U.S. Pat. No. 8,149,382 issued Apr. 3, 2012, which is the National Stage of International Application No. PCT/JP2006/312852, filed Jun. 28, 2006, which claims priority to Japanese Patent Application No. 2005-200178, filed Jul. 8, 2005, the disclosures of which are all incorporated herein by reference in their entirety.

TECHNICAL FIELD

The present invention relates to a surface position detection apparatus, an exposure apparatus, and an exposure method. More particularly, the present invention relates to detection of the surface position of a photosensitive substrate in a projection exposure apparatus used to transfer a mask pattern onto the photosensitive substrate in a lithography process for manufacturing a device such as a semiconductor device, a liquid crystal display device, an imaging device, and a thin-film magnetic head.

BACKGROUND ART

A surface position detection apparatus that detects a surface position using diagonal incident light described in Japanese Laid-Open Patent Publication No. 2001-296105 and corresponding U.S. Pat. No. 6,897,462 (Patent Document 1) is known in the art as a surface position detection apparatus optimal for use as a projection exposure apparatus. To improve the detection accuracy of the surface position of a detected surface theoretically, the diagonal incident light type surface position detection apparatus is required to increase (toward 90 degrees) the incidence angle of a light beam that enters the detected surface. To prevent the structure and arrangement of a projection optical system and a condensing optical system of the surface position detection apparatus from being restricted by the detected surface, a prism having a pair of parallel inner reflection surfaces is arranged in an optical path of the projection optical system and in an optical path of the condensing optical system so as to arrange the projection optical system and the condensing optical system distant from the detected surface (refer to FIG. 7 in Patent Document 1).

Patent Document 1: Japanese Laid-Open Patent Publication No. 2001-296105

DISCLOSURE OF THE INVENTION

Problems that are to be Solved by the Invention

However, in the conventional surface position detection apparatus described in FIG. 7 of Patent Document 1, a light beam reflected totally by the two parallel inner reflection surfaces of the projection side rhombic prism may cause relative displacement of polarization components. As a result, a clear pattern image may not be formed on the detected surface. In the same manner, a light beam reflected totally by the two parallel inner reflection surfaces of the light receiving side rhombic prism may cause relative displacement of polarization components. This may result in a secondary image of the pattern becoming further bluredly.

In an exposure apparatus, when such a conventional surface position detection apparatus is used to detect the surface position of a wafer (photosensitive substrate) of which surface is coated with a resist, the reflectivity of light with a specific polarization component is known to change in accordance with the thickness of the resist layer. Due to the relative displacement of polarization components in the light beam passing through the inner reflection surfaces of rhombic prisms and reflectivity changes caused by the thickness of the resist layer of the photosensitive substrate, detection errors of the surface position of the detected surface are apt to occur in the conventional surface position detection apparatus.

In view of the above problem, it is an object of the present invention to provide a surface position detection apparatus that detects the surface position of a detected surface with high precision without being virtually affected by relative displacement of polarization components in a light beam passing through a reflection surface. It is also an object of the present invention to provide an exposure apparatus, an exposure method, and a device manufacturing method that enable a pattern surface of a mask and an exposed surface of a photosensitive substrate to be aligned with a projection optical system with high precision using a surface position detection apparatus that detects the surface position of a detected surface with high precision.

Solutions for Solving the Problems

To solve the above problem, a first aspect of the present invention provides a surface position detection apparatus including a projection system which projects a light beam in a diagonal direction onto a detected surface and a light receiving system which receives a light beam reflected by the detected surface. The surface position detection apparatus detects a surface position of the detected surface based on an output of the light receiving system. The projection system includes a first reflection surface. The light receiving system includes a second reflection surface. The surface position detection apparatus further includes a displacement offset member which offsets relative displacement of polarization components in a light beam passing through the first reflection surface of the projection system and the second reflection surface of the light receiving system.

A second aspect of the present invention provides a surface position detection apparatus including a projection system which projects a light beam in a diagonal direction onto a detected surface and a light receiving system which receives a light beam reflected by the detected surface. The surface position detection apparatus detects a surface position of the detected surface based on an output of the light receiving system. At least one of the projection system and the light receiving system includes a reflection surface. The surface position detection apparatus further includes a displacement offset member which offsets relative displacement of polarization components in a light beam passing through the reflection surface.

A third aspect of the present invention provides a surface position detection apparatus including a projection system which projects a light beam in a diagonal direction onto a detected surface and a light receiving system which receives a light beam reflected by the detected surface. The surface position detection apparatus detects a surface position, of the detected surface based on an output of the light receiving system. The projection system includes a first reflection surface and a projection side depolarizer arranged at a light-emitting side of the first reflection surface. The light receiving system includes a second reflection surface arranged in correspondence with the first reflection surface and a light receiving side depolarizer arranged at a light entering side of the second reflection surface.

A fourth aspect of the present invention provides an exposure apparatus for projecting and exposing a predetermined pattern onto a photosensitive substrate with a projection optical system. The exposure apparatus includes a surface position detection apparatus according to any one of the first to third aspects for detecting a surface position of the predetermined pattern surface or an exposed surface of the photosensitive substrate with respect to the projection optical system as the surface position of the detected surface. An alignment means aligns the predetermined pattern surface or the exposed surface of the photosensitive substrate with the projection optical system based on a detection result of the surface position detection apparatus.

A fifth aspect of the present invention provides an exposure method for projecting and exposing a predetermined pattern onto a photosensitive substrate with a projection optical system. The exposure method includes a detection step of using the surface position detection apparatus according to any one of the first to third aspects to detect a surface position of the predetermined pattern surface or an exposed surface the photosensitive substrate with respect to the projection optical system as the surface position of the detected surface, and an alignment step of aligning the predetermined pattern surface or the exposed surface of the photosensitive substrate with the projection optical system based on a detection result of the detection step.

A sixth aspect of the present invention provides a device manufacturing method including an exposure step of projecting and exposing a predetermined pattern onto a photosensitive substrate with a projection optical system, a detection step of using the surface position detection apparatus according to any one of the first to third aspects to detect a surface position of the predetermined pattern surface or an exposed surface of the photosensitive substrate with respect to the projection optical system as the surface position of the detected surface, an alignment step of aligning the predetermined, pattern surface or the exposed surface of the photosensitive substrate with the projection optical system based on a detection result of the detection step, and a development step of developing the photosensitive substrate that has undergone the exposure step.

A seventh aspect of the present invention provides a method for manufacturing a surface position detection apparatus including a projection system, which projects a light beam in a diagonal direction onto a detected surface, and a light receiving system, which receives a light beam reflected by the detected surface. The surface position detection apparatus detects a surface position of the detected surface based on an output of the light receiving system. The method includes the steps of preparing a first reflection surface arranged in the projection system, preparing a second reflection surface arranged in the light receiving system, and offsetting relative displacement of polarization components in a light beam passing through the first reflection surface of the projection system and the second reflection surface of the light receiving system.

An eighth aspect of the present invention provides an adjustment method for a surface position detection apparatus including a projection system, which projects a light beam through a first reflection surface in a diagonal direction onto a detected surface, and a light receiving system, which receives a light, beam reflected by the detected surface through a second reflection surface. The surface position detection apparatus detects a surface position of the detected surface based on an output of the light receiving system. The adjustment method includes the steps of preparing a polarizing member for generating an emission light beam having different characteristics in accordance with polarization components of an incident light beam, and using the polarizing member to offset relative displacement of polarization components in a light beam passing through the first reflection surface of the projection system and the second reflection surface of the light receiving system.

Effect of the Invention

A surface position detection apparatus according to a typical aspect of the present invention includes an offset element arranged in a pupil space of a projection system or in a pupil space of a light receiving system to change the travel direction of an emission light beam by a different angle in accordance with the deflection direction of an incident light beam or an offset element arranged in an object space or an image space of a projection system or in an object space or an image Space of a light receiving system to shift in parallel, the travel, direction of an emission light beam by a different distance from the deflection direction of an incident light beam as a displacement offset member for offsetting relative displacement of polarization components in a light beam passing through a reflection surface of at least one of the projection system and the light receiving system. The offset element functions to enable the surface position of a detected surface to be detected with high precision without substantially being affected by relative displacement of polarization components in a light beam passing through the reflection surface or the like.

Further, a surface position detection apparatus according to another aspect of the present invention includes a depolarizer for reducing relative displacement of polarization components in a light beam passing through a reflection surface in a projection system and a reflection surface in a light receiving system. The depolarizer enables the surface position of a detected surface to be detected with high precision without being substantially affected by relative displacement of polarization components of a light beam passing through the reflection surface or the like.

Accordingly, when the surface position detection apparatus of the present invention is applied to detect the surface position of a photosensitive substrate with respect to a projection optical system in an exposure apparatus, the surface position detection apparatus detects the surface position of the detected surface with high precision without being substantially affected by relative displacement of polarization components in a light beam passing through the reflection surface or the like and enables a pattern surface of a mask to be aligned with an exposed surface of the photosensitive substrate relative to the projection optical system with high precision. This enables a device to be manufactured in a satisfactory manner.

Figure 1:
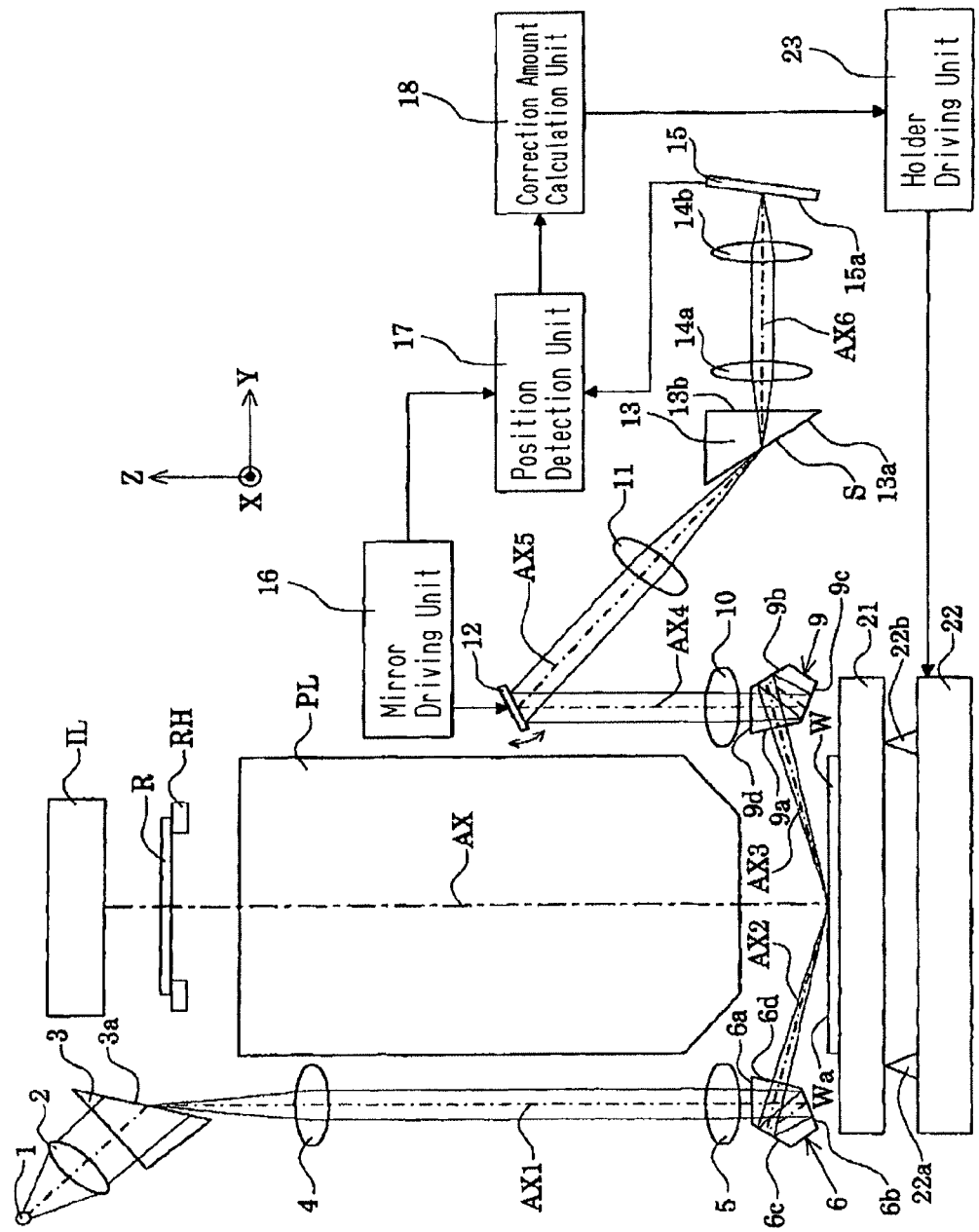
FIG. 1 is a schematic diagram showing the structure of an exposure apparatus including a surface position detection apparatus according to an embodiment of the present invention.

DESCRIPTION OF REFERENCE NUMERALS 1 light source
2 condenser lens
3 deflection prism
4, 5 projection optical system
6, 9 pentaprism
7, 8 rhombic prism
10, 11 condensing optical system
12 oscillating mirror
13 perspective correction prism
14a, 14b relay optical system
15 light receiving unit
16 mirror driving unit
17 position detection unit
18 correction amount calculation unit
19 Nomarski prism (first offset element)
20 beam displacer (second offset element)
21 wafer holder
22 holder supporting mechanism
23 holder driving unit
31 half-wave plate (phase member)
32, 33 depolarizer
IL illumination system
R reticle
RH reticle holder
PL projection optical system
W wafer

BEST MODE FOR CARRYING OUT THE INVENTION

Figure 2:
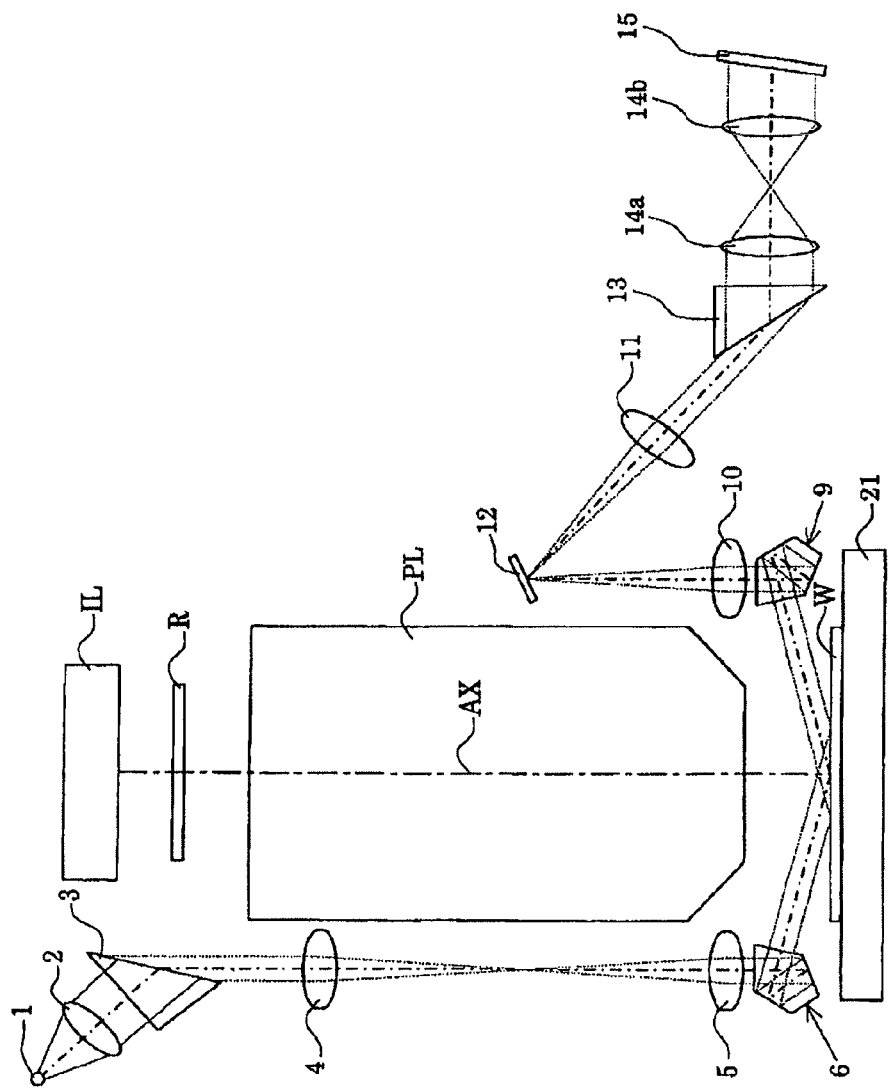
FIG. 2 is a schematic optical path diagram illustrating that a projection optical system and a condensing optical system shown in FIG. 1 are both-side telecentric.
Figure 3:
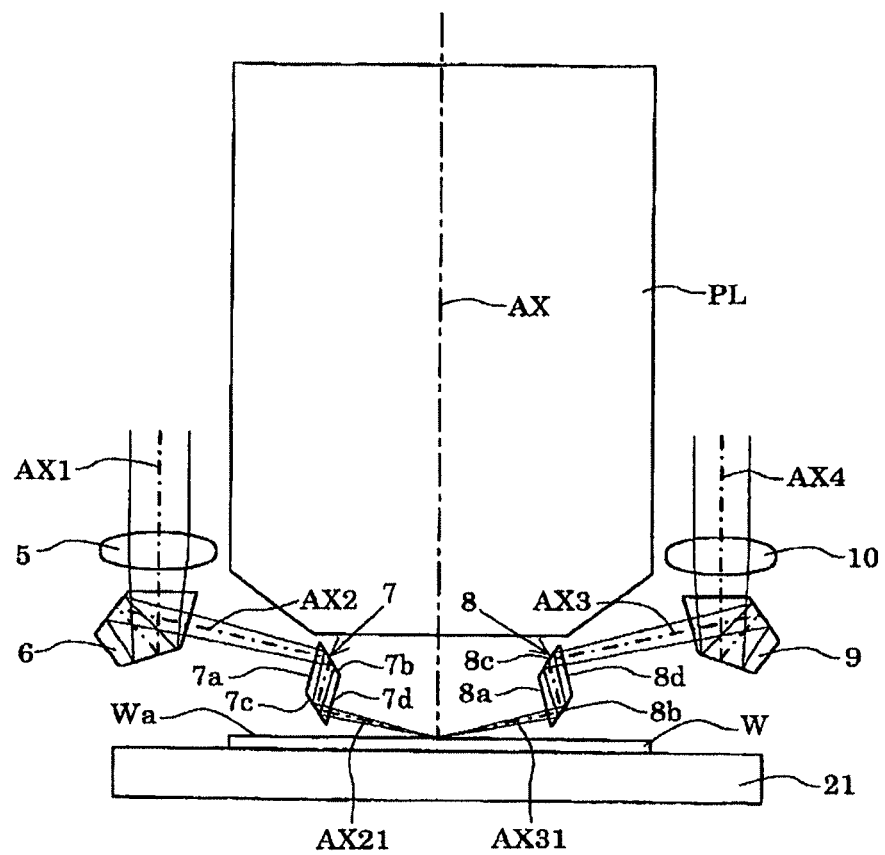
FIG. 3 is a schematic diagram showing the structure between a pair of pentaprisms in the surface position detection apparatus of the present embodiment.

One embodiment of the present invention will now be described with reference to the accompanying drawings. FIG. 1 is a schematic diagram showing the structure of an exposure apparatus that includes a surface position detection apparatus according to the embodiment of the present invention. FIG. 2 is an optical path diagram showing that a projection optical system and a condensing optical system in FIG. 1 are both-side telecentric. FIG. 3 is a schematic diagram showing the structure between a pair of pentaprisms in the surface position detection apparatus according to the embodiment of the present embodiment.

To make the drawings clear, FIGS. 1 and 2 do not show the structure between the pentaprisms 6 and 9. In FIG. 1, a the Z-axis is set to be parallel to an optical axis AX of a projection optical system PL, a Y-axis is set to be parallel to the plane of FIG. 1 within a plane orthogonal to the optical axis AX, and an X-axis is set to be orthogonal to the plane of FIG. 1. In the present embodiment, the surface position detection apparatus of the present invention is used to detect the surface position of a photosensitive substrate in a projection exposure apparatus.

The shown exposure apparatus includes an illumination system. IL for illuminating a reticle R used as a mask, on which a predetermined pattern is formed, with illumination light (exposure light) emitted from an exposure light source (not shown). A reticle holder PH supports the reticle R on a reticle stage (not shown) in a manner that the reticle R is parallel to the XY plane. The reticle stage is movable in a two-dimensional manner along a reticle surface (that is, the XY plane) when driven by a drive system (not shown). The coordinates representing the position of the reticle stage are measured by a reticle interferometer (not shown) to control the position of the reticle stage.

Light from the pattern of the reticle R enters the projection optical system. Pt, which forms a pattern image of the reticle R on a surface (exposed surface) Wa of a wafer W, which is a photosensitive substrate. The wafer W is held on a wafer holder 21, and the wafer holder 21 is supported by a holder supporting mechanism 22. The holder supporting mechanism 22 supports the wafer holder 21 with three support points 22a to 22c (only two support points 22a and 22b are shown in FIG. 1), which are movable in upward and downward directions (Z-direction).

A holder driving unit 23 controls the upward and downward movement of the support points 22a to 22c of the holder supporting mechanism 22 to level and move the wafer holder 21 in the Z-direction (focusing direction). This consequently levels and moves the wafer W in the Z-direction. The wafer holder 21 and the holder supporting mechanism 22 are further supported on a wafer stage (not shown). The wafer stage is movable in a two-dimensional manner along a wafer surface (i.e., the XY plane) when driven by a drive mechanism (not shown) and is also rotatable about the Z-axis. The coordinates representing the position of the wafer stage are measured by a wafer interferometer (not shown) to control the position of the wafer stage.

To transfer a circuit pattern formed on the pattern surface of the reticle R onto exposure fields of the exposed surface Wa of the wafer W in a satisfactory manner, each exposure field in the exposed surface Wa must be positioned during exposure within the range of the focal depth of the projection optical system PI, that is centered about an imaging plane of the projection optical system PL. To position an exposure field, the surface positions of points in the present exposure field, that is, surface positions along the optical axis AX of the projection optical system PL may first be accurately detected. Then, the wafer holder 21 may be leveled and moved in the Z-direction to consequently level and move the wafer W in the Z-direction so that the exposed surface Wa falls within the range of the focal depth of the projection optical system PL.

Accordingly, the projection exposure apparatus of the present embodiment includes a surface position detection apparatus for detecting the surface position of each point within the present exposure field of the exposed surface Wa. Referring to FIG. 1, the surface position detection apparatus of the present embodiment includes a light source 1 for supplying detection light. The surface Wa of the wafer W, which serves as the detected surface, is normally coated with a thin film of resist or the like. To reduce the influence of interference between light and the thin film, it is preferable that the light source 1 be a white light source having a wide wavelength range (e.g., a halogen lamp that supplies illumination light having a wavelength range of 600 to 900 nm or a xenon light source that supplies illumination light in a similar band as the halogen lamp) A light emitting diode that supplies light in a wavelength band in which resist has weak photosensitivity may also be used as the light source 1.

A divergent beam from the light source 1 is converted to a generally parallel beam by a condenser lens 2 and then enters a deflection prism 3. The deflection prism 3 deflects the generally parallel light beam from the condenser lens 2 in the −Z direction by refracting the light beam. A transmissive lattice pattern 3a is formed at a light-emitting side of the deflection prism 3. The transmissive lattice pattern 3a is formed by alternately arranging elongate light transmitting portions extending in the direction and elongated light shielding portions extending in the X-direction at regular intervals. Alternatively, a reflective diffraction grating having projections and recesses or a reflective lattice pattern formed by alternately forming reflective portions and non-reflective portions may be used in lieu of the transmissive lattice pattern.

Light passing through the transmissive lattice pattern 3a enters a projection optical system (4 and 5), which is arranged along an optical axis AM that is parallel to the optical axis AX of the projection optical system. The projection optical system (4 and 5) is formed by a projection condenser lens 4 and a projection optical lens 5. A light beam passing through the projection optical system (4 and 5) enters a pentaprism 6. The pentaprism 6 is a pentagonal deflection prism with a longitudinal, axis extending in the X-direction. The pentaprism 6 has a first transmissive surface 6a for transmitting incident light along the optical axis AX1 without refracting the incident light. The first transmissive surface 6a is set to be orthogonal to the optical axis AX1.

Light passing through the first transmissive surface 6a and propagating inside the pentaprism 6 along the optical axis AX1 is reflected by a first reflection surface 6b and then reflected again by a second reflection surface 6c along an optical axis AX2. The light reflected by the second reflection surface 6c and propagating inside the pentaprism 6 along the optical axis AX2 passes through a second transmissive surface 6d without being refracted by the second transmissive surface 6d. The second transmissive surface 6d is set to be orthogonal to the optical axis AX2.

The pentaprism 6 is formed from an optical material having low thermal expansion and low divergent properties, such as quartz glass. A reflection film made of, for example, aluminum or silver is formed on the first reflection surface 6b and the second reflection surface 6c.

Light entering the pentaprism 6 in the −Z direction along the optical axis AX1 is significantly deflected by the pentaprism 6 and guided along the optical axis AX2 toward the detected surface Wa. The direction of the optical axis AX2 is set so that the incidence angle on the detected surface Wa is sufficiently large. This consequently sets the deflection angle at which the light is deflected by the pentaprism 6. More specifically, as shown in FIG. 3, a light beam emitted from the pentaprism 6 along the optical axis AX2 enters a projection side rhombic prism 7.

The rhombic prism 7 is a quadratic prism having a rhombic cross-section. The longitudinal axis of the rhombic prism 7 extends in the X-direction in the same manner as the pentaprism 6. In the rhombic prism 7, light passing through a first transmissive surface 7a, which is orthogonal to the optical axis AX2, is sequentially reflected by two parallel reflection surfaces 7b and 7c and then passes through a second transmissive surface 7d, which is parallel to the first transmissive surface 7a. The light is then emitted from the rhombic prism 7 along an optical axis AX21 that is parallel to the optical axis AX2. The light beam emitted from the rhombic prism 7 along the optical axis AX21 enters the detected surface Wa.

In a state in which the detected surface Wa coincides with an imaging plane of the projection optical System PL, the projection optical system (4 and 5) is formed so that the surface on which the lattice pattern 3a is formed (that is, the light emitting surface of the deflection prism 3) and the detected surface Wa are conjugate to each other. Also, the surface on which the lattice pattern 3a is formed and the detected surface Wa satisfy the Scheimpflug condition with respect to the projection optical system (4 and 5). As a result, light from the lattice pattern 3a is precisely focused over the entire pattern image formation surface of the detected surface Wa with the projection optical system (4 and 5).

The optical path indicated by a broken line in FIG. 2, shows that the projection optical system (4 and 5), which is formed by the projection condenser lens 4 and the projection objective lens 5, is a both-side telecentric optical system. Accordingly, points on the formation surface of the lattice pattern 3a and the detected surface Wa that are conjugate to each other have the same magnification over the entire surfaces. In this manner, referring to FIG. 4, a primary image of the lattice pattern 3a is accurately formed over the entire detected surface Wa.

Referring again to FIG. 1, a light beam reflected by the detected surface Wa along an optical axis AX31, which is symmetric to the optical axis AX21 with respect to the optical axis AX of the projection optical system PL, enters a light receiving side rhombic prism 8. The rhombic prism 8 is a quadratic prism having a longitudinal axis extending in the X-direction and having a rhombic cross-section like the rhombic prism 7. In the rhombic prism 8, light passing through a first transmissive surface 8a, which is orthogonal to the optical axis AX31, is sequentially reflected by two parallel reflection surfaces 8b and 8c and then passes through a second transmissive surface 8d, which is parallel to the first transmissive surface 8a. The light is emitted from the rhombic prism 8 along an optical axis AX3, which is parallel to the optical axis AX31.

The light emitted from the rhombic prism 8 along the optical axis AX3 enters a condensing optical system (10 and 11) after passing through a pentaprism 9, which has the same structure as the pentaprism 6 described above. More specifically, light reflected by the detected surface Wa enters the pentaprism 9 along the optical axis AX3, which is symmetric to the optical axis AX2 with respect to the optical axis AX of the projection optical system PL. In the pentaprism 9, light passing through a first transmissive surface 9a, which is orthogonal to the optical axis AX3, is sequentially reflected by a first reflection surface 9b and a second reflection surface 9c and then reaches a second transmissive surface 9d along an optical axis AX4 extending in the Z-direction. Light passing through the second transmissive surface 9d, which is orthogonal to the optical axis AX4, enters the condensing optical system (10 and 11) in the A-Z direction along the optical axis AX4.

The condensing optical system (10 and 11) is formed by a light receiving objective lens 10 and a light receiving condenser lens 11. An oscillating mirror 12, which serves as a scanning means, is arranged in an optical path formed between the light receiving objective lens 10 and the light receiving condenser lens 11. Thus, light entering the light receiving objective lens 10 along the optical axis AX4 is deflected by the oscillating mirror 12 and reaches the light receiving condenser lens 11 along an optical axis AX5. In the present embodiment, the oscillating mirror 12 is generally arranged at a pupil plane of the condensing optical system (10 and 11). However, the present invention is not limited in such a manner and the oscillating mirror 12 may be arranged at any position in the optical path formed between the detected surface Wa and a perspective correction prism 13, which will be described later, or at an optical path formed between the detected surface Wa and the deflection prism 3.

Light passing through the condensing optical system (10 and 11) enters the perspective correction prism 13, which has the same structure as the deflection prism 3. In a state in which the detected surface Wa coincides with the imaging plane of the projection optical system PL, the condensing optical system (10 and 11) is formed so that the detected surface Wa and a light entering surface 13a of the perspective correction prism 13 are conjugate to each other. With this structure, a secondary image of the lattice pattern 3a is formed on the light entering surface 13a of the perspective correction prism 13.

Figure 5:
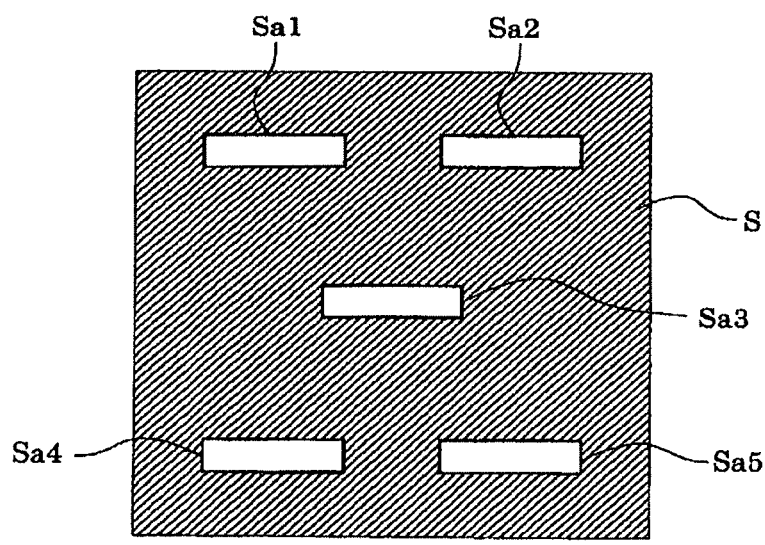
FIG. 5 is a schematic diagram showing the structure of a light receiving slit S having five rectangular open portions Sa1 to Sa5 elongated in the X-direction.

The light entering surface 13a of the perspective correction prism 13 includes a light receiving slit S, which serves as a light shielding means. As shown in FIG. 5, the light receiving slit S may include, for example, five open portions Sa1 to Sa5, each of which has an elongated rectangular shape extending in the X-direction. Light reflected from the detected surface Wa and passing through the condensing optical system (10 and 11) enters the perspective correction prism 13 through the open portions Sa1 to Sa5 of the light receiving slit S.

Figure 4:
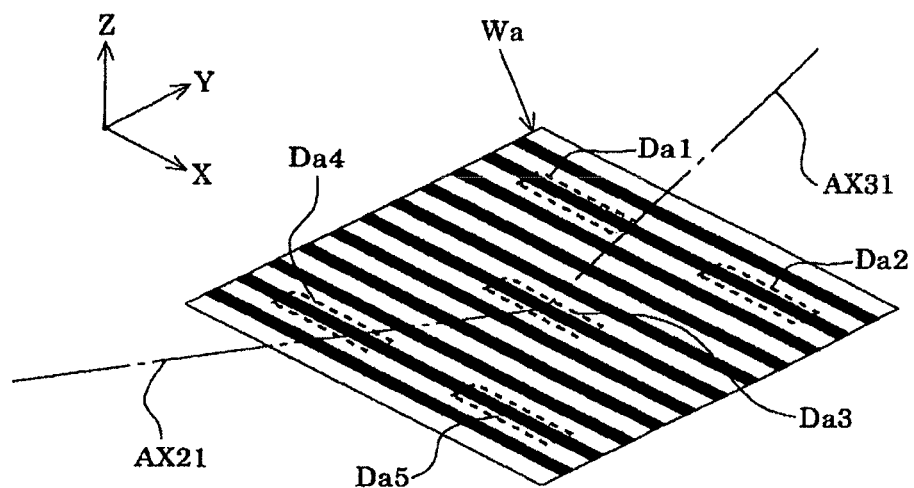
FIG. 4 is a perspective diagram showing a detected surface Wa on which a primary image of a lattice pattern 3a is formed.

The number of the open portions Sa of the light receiving slit S corresponds to the number of detection points on the detected surface Wa. FIG. 4 shows the detected surface Wa on which a primary image of the lattice pattern 3a is formed. In this state, detection points (detection regions) Da1 to Da5 on the detected surface Wa optically correspond to the five open portions Sa1 to Sa5 of the light receiving slit S shown in FIG. 5. The number of detection points on the detected surface Wa may be increased by just increasing the number of open portions Sa. An increase in the number of detection points does not make the structure complicated.

The imaging plane of the projection optical system PL and the light entering surface 13a of the perspective correction prism 13 satisfy the Scheimpflug condition with respect to the condensing optical system (10 and 11). Accordingly, in a state in which the detected surface Wa and the imaging plane coincide with each other, light from the lattice pattern 3a is accurately focused again over the entire pattern image formation surface on the prism light entering surface 13a by the condensing optical system (10 and 11).

As shown by the optical path indicated by a broken line in FIG. 2, the condensing optical system (10 and 11) is a two-side telecentric optical system. Accordingly, points on the detected surface Wa and conjugate points on the prism light entering surface 13a have the same magnification over the entire surface. Thus, a secondary image of the lattice pattern 3a is accurately formed over the entire light entering surface 13a of the perspective correction prism 13.

When a light receiving surface is located at the light entering surface 13a of the perspective correction prism 13, an incidence angle $\theta$ of a light beam on the detected surface Wa is large. Thus, the incidence angle of the light beam on the light receiving surface increases accordingly. In this case, if, for example, a silicon photodiode is arranged on the light receiving surface, a light beam enters the silicon photodiode at a large incidence angle. This increases the surface reflection of the silicon photodiode and causes vignetting. This may result in a significant decrease of the light receiving amount.

To prevent the light receiving amount from decreasing due to the incidence angle of a light beam on the light receiving surface, in the present embodiment, the light entering surface 13a of the perspective correction prism 13, which serves as a deflection optical system, is arranged on a surface conjugate to the detected surface Wa with respect to the condensing optical system (10 and 11). As a result, a light beam incident on the light entering surface 13a of the perspective correction prism 13 along the optical axis AX5 with the condensing optical system (10 and 11) is deflected at a refraction angle that is the same as the vertex angle of the perspective correction prism 13 (angle formed by the light receiving surface and the light emitting surface) and then emitted from the light, emitting surface 13b along optical axis AX6. The light emitting surface 13b is set to be orthogonal to the optical axis AX6.

Figure 6:
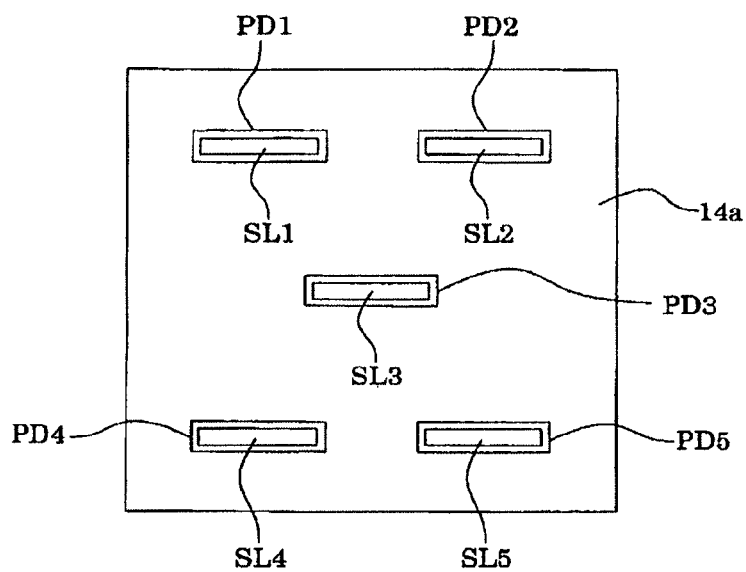
FIG. 6 shows a light receiving surface 14a of a light receiving unit 14 on which five silicon photodiodes PD1 to PD5 are arranged to optically correspond to the open portions Sa1 to Sa5 of the light receiving slit S.

The light beam emitted from the light emitting surface 13b of the perspective correction prism 13 along the optical axis AM enters a relay optical system (14a and 14b), which is formed by two lenses 14a and 14b. Light passing through the relay optical system (14a and 14b) forms an image conjugate to the secondary image of the lattice pattern 3a formed on the light entering surface 13a of the perspective correction prism 13 and the open portions Sa1 to Sa5 of the light receiving slit S on the light receiving surface 15a of the light receiving unit 15. As shown in FIG. 6, five silicon photodiodes PD1 to PD5 formed on the light receiving surface 15a optically correspond to the open portions Sa1 to Sa5 of the light receiving slit S. Two-dimensional CCDs (charge-coupled device) or photomultipliers may be used in lieu of the silicon photodiodes.

As described above, in the present embodiment, the perspective correction prism 13 serving as a deflection optical system is used. This sufficiently decreases the incidence angle of the light beam entering the light receiving surface 15a and prevents the light receiving amount from being decreased by the incidence angle of the light beam on the light receiving surface 15a. It is preferable that the relay optical system (14a and 14b) be a both-side telecentric optical system as shown in FIG. 2. It is further preferable that the light entering surface 13a and the light receiving surface 15a of the perspective correction prism 13 satisfy the Scheimpflug condition with respect to the relay optical system (14a and 14b).

As described above, the light entering surface 13a of the perspective correction prism 13 includes the light receiving slit S, which has the five open portions Sa1 to Sa5. Thus, the light receiving slit S partially shields light from the secondary image of the lattice pattern 3a formed on the light entering surface 13a. In other words, only the light beam from the secondary image of the lattice pattern 3a that is formed in the regions of the open portions Sa1 to Sa5 of the light receiving slit S pass through the perspective correction prism 13 and the relay optical system (14a and 14b) and reach the light receiving surface 15a.

In this manner, referring to FIG. 6, images of the open portions Sa1 to Sa5 of the light receiving slit S, that is, slit images SL1 to SL5, are formed on the silicon photodiodes PD1 to PD5, which are arranged on the light receiving surface 15a of the light receiving unit 15. The slit images SL1 to SL5 are formed inside the rectangular light receiving regions of the silicon photodiodes PD1 to PD5.

When the detected surface Wa is moved upward and downward in the Z-direction along the optical axis AX of the projection optical system PL, the secondary image of the lattice pattern 3a formed on the light entering surface 13a of the perspective correction prism 13 is displaced laterally in the pitch direction of the pattern in accordance with the upward and downward movement of the detected surface Wa. In the present embodiment, for example, the amount of lateral displacement of the secondary image of the lattice pattern 3a may be detected based on the principle of a photoelectric microscope disclosed in Japanese Laid-Open Patent Publication No 6-97045 by the same applicant as the present application. The surface position of the detected surface Wa along the optical axis AX of the projection optical system PL may be detected based on the detected lateral displacement amount.

A mirror driving unit 16 drives the oscillating mirror 12. A position detection unit 17 synchronously detects the waveform of detection signals from the silicon photodiodes PD1 to PD5 based on an alternating current signal from the mirror driving unit 16. A correction amount calculation unit 18 calculates the amount of inclination correction and the amount of correction in the Z-direction required to position the detected surface Wa within the range of the focal depth of the projection optical system PL. The holder driving unit 23 drives the holder supporting mechanism 22 based on the inclination correction amount and the Z-direction correction amount, levels the wafer holder 21, and moves the wafer holder 21 in the Z-direction. Such operations of the mirror driving unit 16, the position detection unit 17, the correction amount calculation unit 18, and the holder driving unit 23 are identical to the operations performed by the apparatuses disclosed in Japanese Laid-Open Patent Publication No. 2001-296105 and its corresponding U.S. Pat. No. 6,897,462 by the same applicant as the present application and will not be described in the present embodiment.

The Scheimpflug condition, the structure and operation of the deflection prism 3 and the perspective correction prism 13, specific applications of the principle of the photoelectric microscope and the like are described in detail in U.S. Pat. No. 5,633,721. The structure and operation of the pentaprisms 6 and 9 are described in detail in Japanese Laid-Open Patent Publication No. 2001-296105 and its corresponding U.S. Pat. No. 6,897,462. Either one or both of the pentaprisms 6 and 9 may be eliminated. U.S. Pat. No. 5,633,721 and U.S. Pat. No. 6,897,462 are incorporated herein by reference.

In the present embodiment, the pentaprism 6 is arranged in the optical path formed between the projection optical system (4 and 5) and the detected surface Na, and the pentaprism 9 is arranged in the optical path formed between the condensing optical system (10 and 11) and the detected surface Na. The optical path of a light beam incident on the detected surface Na and the optical path of a light beam reflected by the detected surface Na are deflected by a significant amount by the pentaprisms 6 and 9 so as to arrange the projection optical system (4 and 5) and the condensing optical system (10 and 11) at positions sufficiently distant from the detected surface Wa. As a result, the structure and arrangement of the projection optical system (4 and 5) and the condensing optical system (10 and 11) are substantially not restricted by the detected surface Wa.

In the present embodiment, the rhombic prism 7 is arranged in the optical, path formed between the pentaprism 6 and the detected surface Wa, and the rhombic prism 8 is arranged in the optical path formed between the pentaprism 9 and the detected surface Wa. Thus, the optical path of a light beam incident on the detected surface Wa and the optical path of a light beam reflected from the detected surface W are each shifted in parallel by the rhombic prisms 7 and 8. As a result, the pentaprisms 6 and 9 are arranged at positions distant from the detected surface Wa. The structure and arrangement of the pentaprisms 6 and 9 and their supporting members are substantially not restricted by the detected surface Wa.

The surface position detection apparatus of the present embodiment includes the projection side prism member, or the rhombic prism 7, and the light receiving side prism member, or the rhombic prism 8. The rhombic prism 7 includes the two inner reflection surfaces (7b and 7c) arranged in the optical path of the projection system to shift in parallel the optical path of an incident light beam. The rhombic prism 8 includes the two inner reflection surfaces (8b and 8c) arranged in correspondence with the projection side prism member 7 in the optical path of the light receiving system to shift in parallel the optical path of an incident light, beam from the detected surface Wa. In this case, relative displacement of polarization components occurs in a light beam totally reflected by the two parallel inner reflection surfaces (7b and 7c) of the projection side rhombic prism 7. As a result, a clear pattern image is not formed on the detected surface Wa.

More specifically, in a light beam reaching the detected surface Wa, relative displacement occurs between p-polarized light and s-polarized light with respect to the detected surface Wa. Consequently, a pattern image formed on the detected surface Wa by the p-polarized light and a pattern image formed on the detected surface Wa by the s-polarized light are displaced relative to each other. In the same manner, relative displacement of polarization components occurs in a light beam reflected by the detected surface Wa and totally reflected by the two parallel inner reflection surfaces (8b and 8c) of the light receiving side rhombic prism 8. As a result, a secondary image of a pattern formed on the light entering surface 13a of the perspective correction prism 13 will becomes further unclear.

In other words, the total reflection on the inner reflection surfaces (8b and 8c) of the light receiving side rhombic prism 8 accentuates relative displacement that occurs between a secondary image of a pattern formed on the light entering surface 13a by the p-polarized light and a secondary image of the pattern formed on the light entering surface 13a by the s-polarized light.

The surface position detection apparatus of the present embodiment is used to detect the surface position of a wafer W that has various different surface states during semiconductor exposure process (e.g., structures on the wafer W being formed from various materials or the wafer W having various structures (multi-layer structure)). The wafer surface is normally coated with a resist. When the surface state of such a wafer W has variations (e.g., when the thicknesses of a layer forming the wafer surface has variations or properties such as the purity of a material forming the wafer surface layer has variations) or the resist thickness has variations, the reflectivity of the wafer surface to light having specific polarization components (e.g., p-polarized light or s-polarized light) changes in accordance with such variations.

If no countermeasures are taken against such a problem, the surface position detection apparatus of the present embodiment would have a tendency of producing detection errors of the surface position of the detected surface Wa due to the relative displacement of polarization components in a light beam passing through the inner reflection surfaces (7b and 7c or 8b and 8c) of the rhombic prisms (7 and 8) and the reflectivity changes of specific polarization components caused by the surface state variations of the wafer W or the resist thickness variations of the wafer W.

In recent years, miniaturization of projection exposure patterns has results in a demand for a wafer surface having higher flatness and higher precision for surface position detection. Further, an exposure apparatus using an ArF excimer laser light source tends to have a thinner resist coating on the wafer surface. For such an exposure apparatus, surface position detection errors caused by surface state variations or resist thickness variations described above cannot be ignored.

To cope with this problem, the surface position detection apparatus of the present embodiment includes a displacement offset member for offsetting relative displacement of polarization components in a light beam passing through the inner reflection surfaces (7h and 7c) of the projection side prism member (rhombic prism) 7 and the inner reflection surfaces (8b and 8c) of the light receiving side prism member (rhombic prism) 8.

Figure 7:
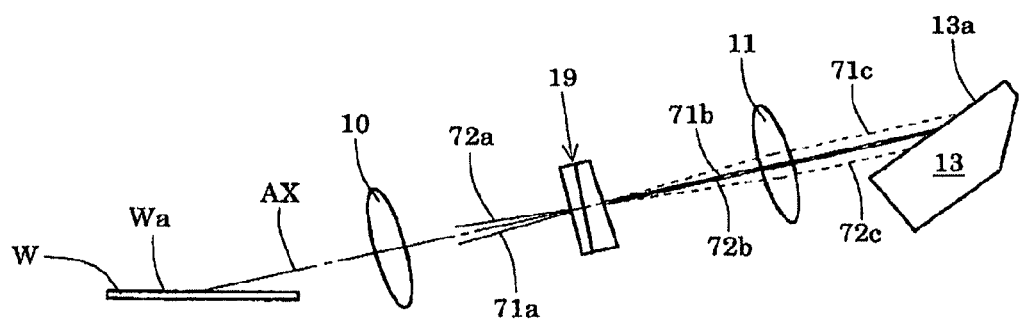
FIG. 7 is a diagram illustrating the structure and operation of a displacement offset member arranged in the surface position detection apparatus of the present embodiment.

FIG. 7 is a diagram describing the structure and effects of the displacement offset member included in the surface position detection apparatus of the present embodiment. For the sake of brevity, FIG. 7 shows an optical path extending from the detected surface Wa to the light entering surface 13a of the perspective correction prism 13 along the linear optical axis AX. The oscillating mirror 12 is not shown. The same applies to FIG. 8, which is related to FIG. 7. Referring to FIG. 7, the surface position detection apparatus of the present embodiment includes a Nomarski prism 19, which serves as the displacement offset member, at a pupil position of the condensing optical system (10 and 11) in the optical path between the light receiving objective lens 10 and the light receiving condenser lens 11 or near the pupil position.

The Nomarski prism 19 is an optical element (first offset element) functioning to change the travel direction of an emission light beam by a different angle depending on the polarization direction of an incident light beam. More specifically, as shown in FIG. 7, the total reflection on the inner reflection surfaces (7b and 7c or 8b and 8c) of the rhombic prisms (7 and 8) causes relative displacement between the p-polarized light and the s-polarized light, and representative p-polarized light 71a and representative s-polarized light 72a, which are inclined at different angles with respect to the optical axis AX, enter the Nomarski prism 19 at substantially a single point on the optical axis AX. Based on its function for changing the travel direction of an emission light beam by the different angle from the polarization direction of an incident light beam, the Nomarski prism 19 converts the incident p-polarized light 71a, which is inclined to the optical axis AX, into p-polarized emission light 71b that substantially travels along the optical axis AX and also converts the incident s-polarized light 72a, which is inclined with respect to the optical axis AX, into s-polarized emission light 72b that travels substantially along the optical axis AX.

In this manner, the relative displacement of the p-polarized light and the s-polarized light caused by the total reflection on the inner reflection surfaces (7b and 7c or 8b and 8c) of the rhombic prisms (7 and 8) is offset by the Nomarski prism 19. As a result, the p-polarized emission light 71b and the s-polarized emission light 72b from the Nomarski prism 19 travel along substantially the same path and reach substantially a single point on the light entering surface 13a of the perspective correction prism 13. As a result, the surface position detection apparatus of, the present embodiment forms a clear secondary image of the pattern on the light entering surface 13a of the perspective correction prism 13 with the Nomarski prism 19, which serves as the displacement offset member, and consequently detects the surface position of the detected surface Wa with high precision without being virtually affected by relative displacement of polarization components in a light beam passing through the inner reflection surfaces (7b and 7c or 8b and 8c) of the prism members (rhombic prisms) 7 and 8. Without the Nomarski prism 19, the p-polarized emission light (indicated by a broken line in the drawing) 71c and the s-polarized emission light (indicated by a broken line in the drawing) 72c from the Nomarski prism 19 would travel along different paths and reach different positions on the light entering surface 13a of the perspective correction prism 13. In such a case, a sharp secondary image of the pattern would not be formed on the light entering surface 13a of the perspective correction prism 13.

In the above description, the Nomarski prism is used as the displacement offset member that functions to change the travel direction of an emission light beam by the different angle from the polarization direction of an incident light beam. However, the present invention is not limited to such a structure. For example, a Wollaston prism may be used in lieu of a Nomarski prism. Further, when a Nomarski prism or a Wollaston prism is used as the displacement correction member, a direct-vision prism may be arranged near the Nomarski prism or the Wollaston Prism to correct color shifting.

For the sake of simplicity, a wedge prism plate formed from a birefringent crystal material, such as calcite, quartz, yttrium orthovanadate crystal, or rutile crystal, may be used in lieu of the prism to cause an incident ordinary light beam and an incident extraordinary light, beam to travel at different angles. In this case, for example, the crystal optical axis and the wedge are oriented to cause the incident ordinary light beam and the incident extraordinary light, beam to travel at different angles. Alternatively, a structure in which such a wedge prism plate and a wedge prism plate made of normal optical glass are bonded together may be used. In such a case, the same advantages are produced as when the above Nomarski prism is used.

In the above description, the Nomarski prism 19 is arranged at or near the pupil position of the condensing optical system (10 and 11) in the optical path formed between the light receiving objective lens 10 and the condensing objective lens 11. However, the present invention is not limited to such a structure and the Nomarski prism may be arranged normally in a pupil space of the projection system or a pupil space of the light receiving system. When arranged in the pupil space of a projection system, the Nomarski prism may be located at or near the pupil position of the projection optical system (4 and 5) in the optical path formed between the projection condenser lens 4 and the projection objective lens 5. Further, when the Wollaston prism us used as the displacement offset member, the Wollaston prism may be arranged in the pupil space of the projection system or the pupil space of the light receiving system. However, when the displacement offset member, such as the Nomarski prism or the Wollaston prism, is added to an existing apparatus to improve performance, it would be easier to arrange the displacement offset member in the pupil space of the light receiving system than in the pupil space of the projection system.

Figure 8:
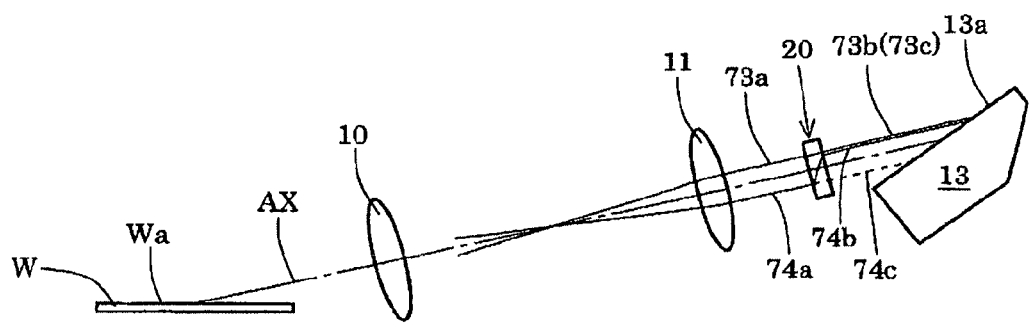
FIG. 8 is a diagram illustrating the main structure and operation of a first modification of the present embodiment.
Figure 9:
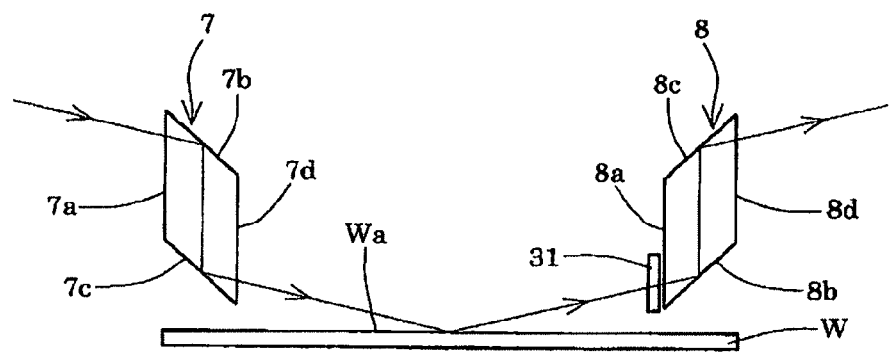
FIG. 9 is a diagram illustrating the main structure and operation of a second modification of the present embodiment.

In the above description, an optical element (such as the Nomarski prism and the Wollaston prism) that functions to change the travel direction of an emission light beam by a different angle from the polarization direction of an incident light beam is used as the displacement offset member. However, the present invention is not limited to such a structure. As shown in FIG. 8, a modification may be made so that an optical element shifts in parallel the travel direction of an emission light beam by a different distance from the polarization direction of an incident light beam (second offset element). Alternatively, as shown in FIG. 9, a modification may be made so that a phase member used as the displacement offset member is arranged in an optical path formed between the projection prism member (rhombic prism) 7 and the light receiving side prism member (rhombic prism 8) to change the polarization direction of an incident light beam.

Referring to FIG. 8, a beam displacer 20, which functions as the displacement offset member of the first modification, is arranged in an optical path between the light receiving condenser lens 11 and the perspective correction prism 13. The beam displacer 20 may be formed of, for example, a birefringent crystal material, such as calcite, quartz, yttrium orthovanadate ($YVO_4$) crystal, or rutile ($TiO_2$) crystal, and functions to emit an incident ordinary light beam and an incident, extraordinary light beam in a manner parallel to each other. In other words, the beam displacer 20 functions to shift in parallel the travel direction of an emission light beam by a different distance from an incident light beam.

More specifically, referring to FIG. 8, relative displacement occurs between the p-polarized light and s-polarized light due to the influence of the total reflection on the inner reflection surfaces (7b and 7c or 8b and 8c) of the rhombic prisms (7 and 8). The representative p-polarized light 73a and s-polarized light 74a travel along different paths that are substantially parallel to the optical axis AX and enter the beam displacer 20. Based on the function for shifting in parallel the travel direction of an emission light beam by a different distance from the incident light beam, the beam displacer 20 transmits the incident p-polarized light 73a and converts the p-polarized light 73a to p-polarized emission light 73b, which travels along a path that extends substantially parallel to the optical axis AX, and also shifts in parallel the incident s-polarized light 74a to convert the s-polarized light 74a to s-polarized emission light 74b that travels substantially along the same path as the p-polarized emission light 73b.

In this manner, the beam displacer 20 functions to offset the relative displacement of the p-polarized light and the s-polarized light caused by the total reflection at the inner reflection surfaces (7b and 7c or 8b and 8c) of the rhombic prisms (7 and 8). As a result, the p-polarized light 73b and the s-polarized light 74h emitted from the beam displacer 20 travel substantially along the same path and reach substantially a single point on the light entering surface 13a of the perspective correction prism 13. As a result, in the first modification example shown in FIG. 8, the beam displacer 20, which functions as the displacement offset member, also enables a sharp secondary image of a pattern to be formed on the light entering surface 13a of the perspective correction prism 13 and consequently enables the surface position of the detected surface Wa to be detected with high precision. Without the beam displacer 20, the p-polarized light 73c and the s-polarized light 74c (indicated by a broken line in the drawing) emitted from the beam displacer 20 would travel along different paths and reach different positions on the light entering surface 13a of the perspective correction prism 13. In such a case, a sharp secondary image of the pattern is not formed on the light entering surface 13a of the perspective correction prism 13.

In the first modification, the beam displacer 20 is arranged in the optical path formed between the light receiving condenser lens 11 and the perspective correction prism 13. In other words, the beam displacer 20 is arranged in an image space of the light receiving system. However, the present invention is not limited to such a structure, and the beam displacer may generally be arranged in the optical path between the deflection prism 3 and the perspective correction prism 13, that is, in an object space or an image space of the projection system or an object space or an image space of the light receiving system. However, when the displacement offset member, such as the beam displacer, is added to an existing apparatus to improve performance, it is preferable that the displacement offset member be arranged in the image space of the light receiving system in order to facilitate optical adjustment.

Referring to FIG. 9, a half-wave plate 31, which functions as a displacement offset member in a second modification, is arranged near the light receiving rhombic prism 8 in an optical path formed between the two prism members (rhombic prisms) 7 and 8. The half-wave plate 31, which is a phase member for changing the polarization direction of an incident light beam, functions to convert incident p-polarized light to s-polarized light and emit the s-polarized light and convert incident s-polarized light to p-polarized light and emit the p-polarized light.

In this case, p-polarized light passing through the inner reflection surfaces (7b and 7c) of the projection side rhombic prism 7 is converted to s-polarized light by the half-wave plate 31 and passes through the inner reflection surfaces (8b and 8c) of the light receiving side rhombic prism 8. In the same manner, s-polarized light passing through the inner reflection surfaces (7h and 7c) of the projection side rhombic prism. 7 is converted to p-polarized light by the half-wave plate 31 and passes through the inner reflection surfaces (8b and 8c) of the light receiving side rhombic prism 8. In the second modification, displacement of the p-polarized light caused by the total reflection on the inner reflection surfaces (7b and 7c) of the projection side rhombic prism 7 is offset by displacement of the s-polarized light caused by the total reflection on the inner reflection surfaces (8b and 8c) of the light receiving side rhombic prism 8. Displacement of the s-polarized light caused by the total reflection on the inner reflection surfaces (7b and 7c) of the projection side rhombic prism 7 is offset by displacement of the p-polarized light caused by the total reflection on the inner reflection surfaces (8b and 8c) of the light receiving side rhombic prism 8. As a result, in the second modification shown in FIG. 9, the half-wave plate 31, which functions as the displacement offset member, enables a clear secondary image of the pattern to be formed on the light entering surface 13a of the perspective correction prism 13 and consequently enables the surface position of the detected surface Wa to be detected with high precision.

In the second modification described above, the half-wave plate 31 is used as the phase member arranged in the optical path between the projection side prism member 7 and the light receiving side prism member 8 to change the polarization direction of an incident light beam. However, the present invention is not limited to such a structure and a Faraday rotator (Faraday optical rotator) may be used as the phase member in lieu of the half-wave plate 31.

Further, in the second modification described above, the half-wave plate 31, which functions as the phase member, is arranged near the light receiving side rhombic prism 8 in the optical path between the pair of prism members (rhombic prisms) 7 and 8. However, the present invention is not limited to such a structure, and a phase member, such as a half-wave plate, may be arranged at an appropriate position at the projection side or the light receiving side in the optical path between the pair of prism members (rhombic prisms) 7 and 8.

Figure 10:
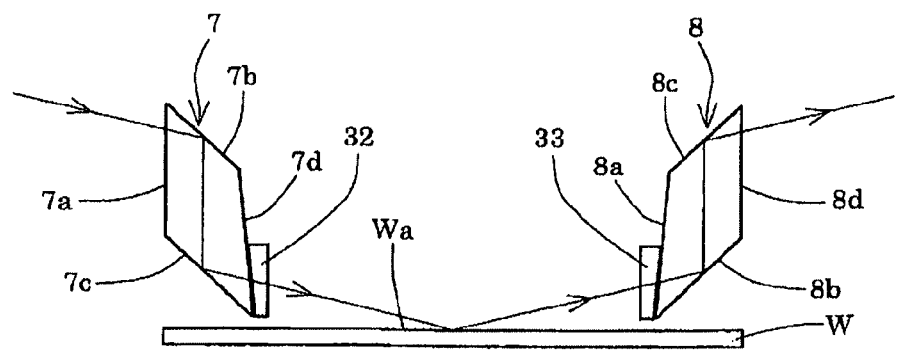
FIG. 10 is a diagram illustrating the main structure and operation of a third modification of the present embodiment.

Also, in the above embodiment and modifications, displacement offset members (19, 20, and 31), which offset the relative displacement of polarization components in a light beam passing through the inner reflection surfaces of the projection side prism member 7 and the inner reflection surfaces of the light receiving side prism member 8, are used. However, the present invention is not limited to such a structure. As shown in FIG. 10, a depolarizer for randomly changing the polarization direction of an incident light beam may be used as a third modification.

In the third modification shown in FIG. 10, a projection side depolarizer 32 is arranged near a light-emitting side of a projection side prism member (rhombic prism) 7 and a light receiving side depolarizer 33 is arranged near a light entering side of a light receiving side prism member (rhombic prism) 8. The depolarizers 32 and 33 may be, for example, deflection prisms (wedge-shaped prisms) formed from a birefringent crystal material, such as quartz crystal or magnesium fluoride, and function to substantially depolarize incident p-polarized light and incident s-polarized light.

In this case, the polarization direction of light before entering the wafer W and after exiting the wafer W is randomized by the two depolarizers 32 and 33. This reduces the influence of changes in the reflectivity of the p-polarized light and s-polarized light caused by the resist layer formed on the wafer W. As a result, in the third modification, the surface position of the detected surface Wa is detected with high precision without being substantially affected by relative displacement of polarization components in a light beam passing through the inner reflection surfaces (7b and 7c or 8b and 8c) of the prism members (rhombic prisms) 7 and 8.

In the present embodiment, a reflection film, such as a metal film made of aluminum, may be formed on an outer surface of each of the inner reflection surfaces (7b and 7c or 8b and 8c) of the projection side rhombic prism 7 and the light receiving side rhombic prism 8. This structure prevents the total reflection phenomenon of the rhombic prisms 7 and 8 and substantially prevents relative displacement of polarization components in a light beam passing through the rhombic prisms 7 and 8.

In the present embodiment, a projection side second rhombic prism may be arranged adjacent to the projection side rhombic prism 7, and a light receiving side second rhombic prism may be arranged adjacent to the light receiving side rhombic prism 8. With this structure, the influence of the total reflection of the inner reflection surfaces (7b and 7c) in the projection side rhombic prism 7 is offset by the influence of the total reflection of the inner reflection surfaces in the projection side second rhombic prism. Further, the influence of the total reflection of the inner reflection surfaces (8b and 8c) in the light receiving side rhombic prism 8 is offset by the influence of the total reflection of the inner reflection surfaces in the light receiving side second rhombic prism. This substantially prevents relative displacement caused by polarization components of a light beam passing through the rhombic prisms 7 and 8.

Further, in the present embodiment, a polarizer for selectively transmitting specific polarization components of an incident light beam may be arranged in an optical path of the projection system or an optical path of the light receiving system. In such a case, the resist layer formed on the wafer W has a higher reflectivity with respect to s-polarized light than p-polarized light. Thus, it is preferable that a polarizing member be used to selectively transmit only s-polarized light with respect to the detected surface Wa. In this structure, only light with a specific polarization component is received. This enables the surface position of the detected surface to be detected with high precision without being affected by relative displacement of polarization components in a light, beam passing through the inner reflection surfaces of the prism member or the like. However, the use of such a polarizer is not practical from the viewpoint of light loss.

In the above embodiment, relative displacement between p-polarized light and s-polarized light is caused by the total reflection in the rhombic prisms (7 and 8), which has inner reflection surfaces. However, relative displacement between p-polarized light and s-polarized light may also be caused by reflection on outer reflection surfaces. In the above embodiment, a modification may be made so that relative displacement between p-polarized light and s-polarized light caused by reflection on such outer reflection surfaces is offset.

In the above embodiment, the exposure apparatus includes a single surface position detection apparatus. However, the present invention is not limited to such a structure and a plurality of surface position detection apparatuses may be used when necessary to divide a detection view field. In this case, the apparatuses may be calibrated based on a detection result obtained in a common view field of the detection field of a first surface position detection apparatus and the detection field of a second surface position detection apparatus.

In the above embodiment, the present invention is applied to the detection of a surface position of a photosensitive substrate in a projection exposure apparatus. However, the present invention may be applied to the detection of a surface position of a mask in a protection exposure apparatus. Further, in the above embodiment, the present invention is applied to the detection of a surface position of a photosensitive substrate in a projection exposure apparatus. However, the present invention may also be applied to the detection of the surface position of any normal detected surface.

The surface position detection apparatus and the exposure apparatus according to the above embodiment are manufactured by assembling various subsystems including elements described, in the claims of the present application so as to maintain predetermined mechanical precision, electric precision, and optical precision. To maintain this precision, the optical systems are adjusted to obtain the optical precision, the mechanical systems are adjusted to obtain the mechanical precision, and the electric systems are adjusted to obtain the electric precision before and after the assembling process. The processes for assembling the exposure apparatus from the subsystems include mechanically connecting the subsystems to one another, wiring the electric circuits, and piping the pressure circuits. Processes for assembling each subsystem are performed before the process for assembling the subsystems to the exposure apparatus. After the process of assembling the exposure apparatus from the subsystems is completed, the apparatus is subjected to overall, adjustment to obtain the required precision. It is preferable that the exposure apparatus be manufactured in a clean room under conditions, such as temperature and cleanness, which are controlled.

For example, a method for manufacturing the surface position detection apparatus of the above embodiment includes a process for preparing a first reflection surface (7*b* and 7*c*) arranged in a projection system, a process for preparing a second reflection surface (8*b* and 8*c*) arranged in a light receiving system, and a process for offsetting relative displacement of polarization components in a light beam passing through the first reflection surface of the projection system and the second reflection surface of the light receiving system.

A method for adjusting the surface position detection apparatus of the above embodiment includes a process for preparing a polarizing member (19, 20, 31, and 33) for generating an emission light beam having a characteristic that differs in accordance with a polarization component of an incident light beam, a process for offsetting relative displacement of polarization components in a light beam passing through the first reflection surface of the projection system and the second reflection surface of the light receiving system.

The exposure apparatus of the above embodiment may be used to fabricate microdevices (including semiconductor devices, imaging devices, liquid crystal display devices, and thin-film magnetic heads) by illuminating a reticle (Mask) with an illumination system (illumination process) and exposing a transfer pattern formed on a mask onto a photosensitive substrate with a projection optical system (exposure process). One example of the procedures for fabricating a semiconductor device serving as a microdevice through formation of a predetermined circuit pattern on a photosensitive substrate, such as a wafer, using the exposure apparatus of the present embodiment will now be described with reference to a flowchart shown in FIG. 11.

Figure 11:
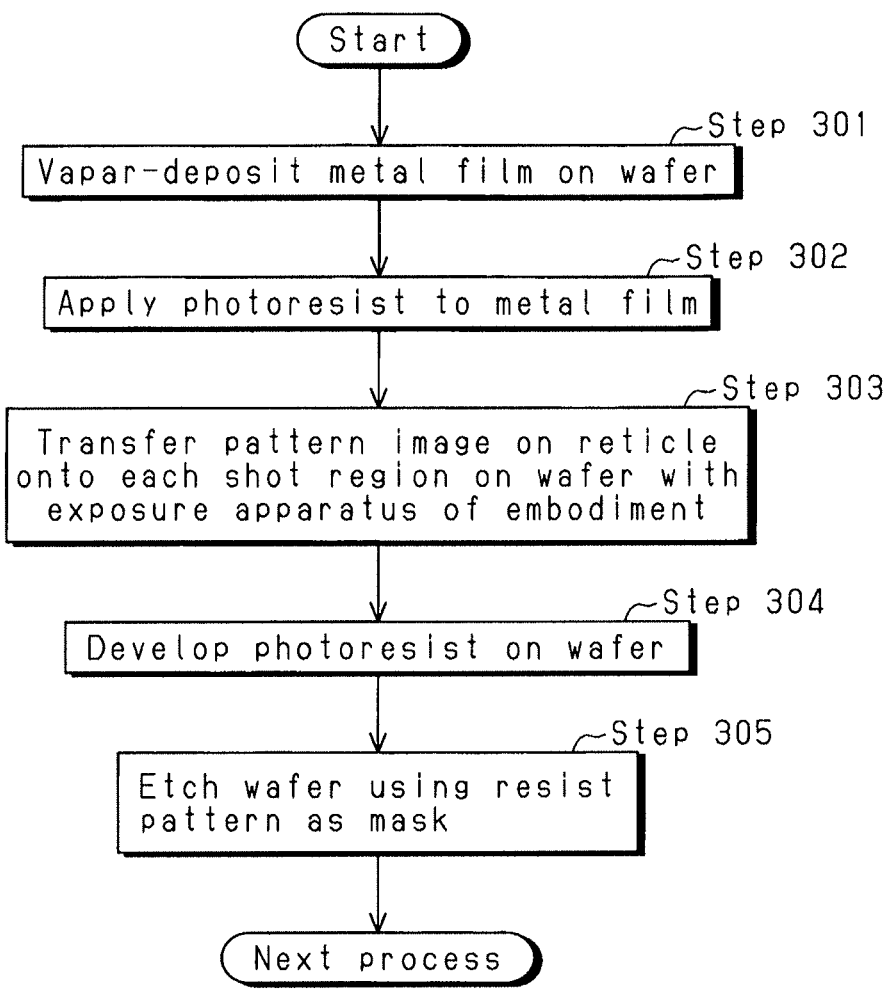
FIG. 11 is a flowchart illustrating the procedures for forming a semiconductor device serving as a microdevice.

In step S301 shown in FIG. 11, a metal film is first vapor-deposited on wafers of a first lot. In step S302, photoresist is applied to the metal film formed on each wafer of the first lot. In step S303, an image of a pattern formed on a mask is exposed and transferred sequentially onto shot-regions of each wafer of the first lot through a projection optical system with the use of the exposure apparatus of the present embodiment. In step S304, the photoresist formed on each wafer of the first lot is developed. In step S305, each wafer of the first lot is etched using the resist pattern formed on the wafer as a mask. This forms a circuit pattern corresponding to the mask pattern in the shot-regions of each wafer.

Afterwards, circuit patterns for upper layers are formed to complete a device such as a semiconductor element. The above-described semiconductor device manufacturing method fabricates semiconductor devices having ultra-fine circuit patterns with a high throughput. In steps S301 to S305, metal is deposited on the wafer through vapor deposition, resist is applied to the metal film, and then the processes in which the resist is exposed, developed, and etched are performed. Prior to these processes, a silicon oxide film may first be formed on the wafer, the resist may be applied to the silicon oxide film, and the processes in which the resist is exposed, developed, and etched may then be performed.

Figure 12:
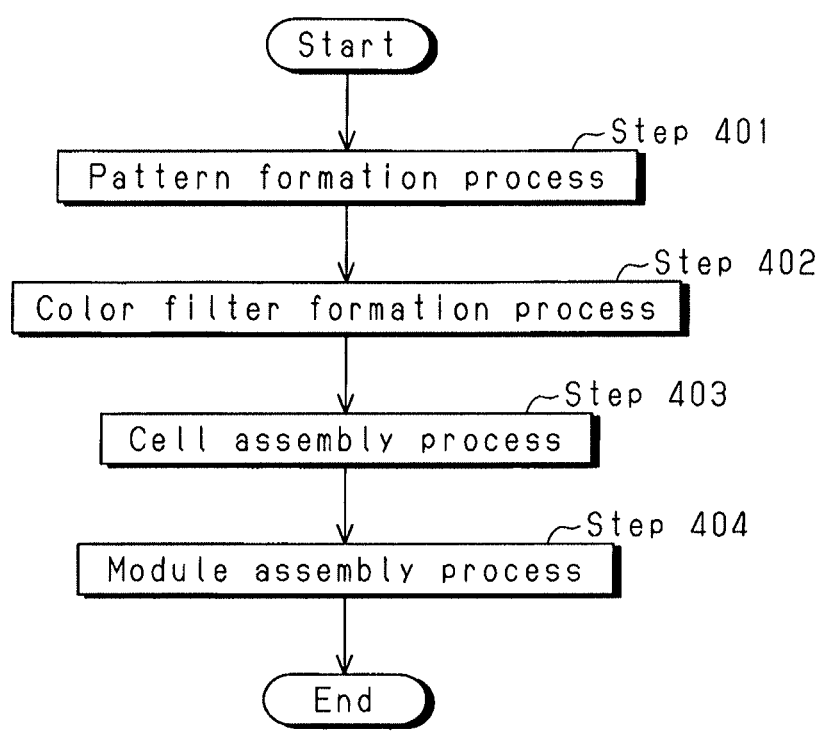
FIG. 12 is a flowchart illustrating the procedures for forming a liquid crystal display device serving as a microdevice.

Further, the exposure apparatus of the present embodiment may be used to fabricate a liquid crystal display device serving as a microdevice by forming a predetermined pattern is circuit pattern or an electrode pattern) on a plate (glass substrate). One example of a method for manufacturing a liquid crystal display device will now be described with reference to a flowchart shown in FIG. 12. In FIG. 12, in a pattern formation process S401, a mask pattern is transferred and exposed onto a photosensitive substrate (e.g., a glass substrate coated with resist) with the exposure apparatus of the present embodiment. In other words, a photolithography process is performed. Through the photolithography process, a predetermined pattern including many electrodes is formed on the photosensitive substrate. Afterwards, a predetermined pattern is formed on the substrate through processes including a developing process, an etching process, and a resist removing process. Then, a color filter formation process is performed in step S402.

In the color filter formation process S402, a color filter is formed by, for example, arranging many sets of R (red), G (green), and B (blue) dots in a matrix, or arranging a plurality of sets of filters formed by R, G, and B stripes in horizontal scanning line directions. After the color filter formation process S402, a cell assembly process is performed in step S403. In the cell assembly process S403, the substrate having a predetermined pattern obtained through the pattern formation process S401 and the color filter or the like obtained through the color filter formation process S402 are assembled together to form the liquid crystal panel (liquid crystal cell).

In the cell assembly process S403, for example, liquid crystal is injected between the substrate having the predetermined pattern obtained through the pattern formation process S401 and the color filter obtained through the color filter formation process S402 to form a liquid crystal panel (liquid crystal cell). In a module assembly process performed subsequently in step S404, an electric circuit for enabling the assembled liquid crystal panel (liquid crystal cell) to perform a display operation and other components including a backlight are attached to complete the liquid crystal display device. With the above-described liquid crystal display device manufacturing method, a liquid crystal display device having an ultra-fine circuit pattern is manufactured with a high throughput.

The invention claimed is:

1. An exposure apparatus which exposes a substrate to exposure light, the apparatus comprising:
   a holder which holds the substrate; and
   a position detection apparatus which detects a position of a surface of the substrate held by the holder, with respect to a direction intersecting the surface, on the basis of a light receiving result of a light beam which is guided to the surface in a diagonal direction relative to the surface and is reflected by the surface,
   the position detection apparatus comprising:
   a first reflection member which reflects the light beam, the first reflection member being arranged in an optical path of the light beam on an incidence side relative to the surface of the substrate held by the holder;
   a second reflection member which reflects the light beam from the surface, the second reflection member being arranged in the optical path of the light beam on a reflection side relative to the surface of the substrate held by the holder; and
   a polarizing member arranged in the optical path of the light beam between the first reflection member and the second reflection member, which changes polarization direction of each of a first polarization component and a second polarization component of the light beam from the first reflecting member, the polarization directions of which are perpendicular to each other, to the polarization direction of the respective other polarization component, wherein the polarizing member converts a P-polarized component of the light beam into an S-polarized component and an S-polarized component of the light beam into a P-polarized component.

2. The exposure apparatus according to claim 1, wherein the polarizing member comprises a half-wave plate or an optical rotation element.

3. The exposure apparatus according to claim 1, wherein at least one of the first and second reflection members comprises a prism member arranged such that the light beam is reflected within the prism member.

4. The exposure apparatus according to claim 3, wherein the prism member is arranged such that the light beam is totally reflected within the prism member.

5. The exposure apparatus according to claim 1, comprising a first optical system arranged in the optical path on the incidence side relative to the surface and a second optical system arranged in the optical path on the reflection side relative to the surface, wherein
the first reflection member is arranged in the optical path on an exit side relative to the first optical system, and the second reflection member is arranged in the optical path on an incidence side relative to the second optical system.

6. The exposure apparatus according to claim 5, wherein each of the first optical system and the second optical system is arranged such that a position which is optically conjugate to the surface of the substrate held by the holder is formed.

7. The exposure apparatus according to claim 5, comprising a patterned surface on which a predetermined pattern is formed, wherein
the first optical system is arranged so as to form a primary image of the predetermined pattern onto the surface of the substrate held by the holder with the light beam arriving from the predetermined pattern, and
the second optical system is arranged so as to form a secondary image of the predetermined pattern with the light beam arriving from the surface on which the primary image is formed.

8. The exposure apparatus according to claim 7, comprising a detection unit which receives the light beam arriving from the secondary image and detects a lateral displacement of the secondary image on the basis of a beam receiving result.

9. The exposure apparatus according to claim 5, wherein each of the first optical system and the second optical system is a both-sides telecentric optical system.

10. The exposure apparatus according to claim 1, comprising a driving unit which drives the holder on the basis of a detection result obtained by the surface position detection apparatus to change at least one of a position of the substrate held by the holder with respect to a direction crossing the substrate and an inclination of the substrate held by the holder.

11. The exposure apparatus according to claim 1, comprising:
a projection optical system which projects the exposure light to form a pattern image onto the surface of the substrate held by the holder, and
a driving unit which drives the holder on the basis of a detection result obtained by the surface position detection apparatus to change at least one of a position of the substrate held by the holder with respect to a direction parallel to an optical axis of the projection optical system and an inclination of the substrate held by the holder with respect to the optical axis.

12. The exposure apparatus according to claim 11, wherein the driving unit drives the holder such that the surface of the substrate is located within a focal depth of the projection optical system.

13. A surface position detection method which detects a position of a surface of a substrate, with respect to a direction intersecting the surface, on the basis of a light receiving result of a light beam which is guided to the surface in a diagonal direction relative to the surface and is reflected by the surface, the method comprising:
reflecting the light beam by a first reflection member arranged in an optical path of the light beam on an incidence side relative to the surface of the substrate;
reflecting the light beam from the surface by a second reflection member arranged in the optical path of the light beam on a reflection side relative to the surface of the substrate; and
changing a polarization direction of the light beam by a polarizing member arranged in the optical path of the light beam between the first reflection member and the second reflection member such that the polarization direction of each of a first polarization component and a second polarization component of the light beam from the first reflecting member, the polarization directions of which are perpendicular to each other, is changed to the polarization direction of the respective other polarization component, wherein a P-polarized component of the light beam is converted into an S-polarized light by the polarizing member and an S-polarized component of the light beam is converted into a P-polarized component by the polarizing member.

14. The surface position detection method according to claim 13, wherein the polarizing member comprises a half-wave plate or an optical rotation element.

15. The surface position detection method according to claim 13, wherein at least one of the first and second reflection members comprises a prism member, and the light beam is reflected within the prism member.

16. The surface position detection method according to claim 15, wherein the light beam is totally reflected within the prism member.

17. The surface position detection method according to claim 13, comprising:
forming a first position which is optically conjugate to the surface of the substrate by a first optical system arranged in the optical path on the incidence side relative to the surface; and
forming a second position which is optically conjugate to the surface of the substrate by a second optical systems arranged in the optical path on the reflection side relative to the surface, wherein
the first reflection member reflects the light beam in the optical path on an exit side relative to the first optical system, and
the second reflection member reflects the light beam in the optical path on an incidence side relative to the second optical system.

18. The surface position detection method according to claim 17, comprising:
forming a primary image of a predetermined pattern arranged at the first position onto the surface of the substrate by the first optical system with the light beam arriving from the predetermined pattern; and forming a secondary image of the predetermined pattern onto a plane including the second position by the second optical system with the light beam arriving from the surface on which the primary image is formed.

19. The surface position detection method according to claim 18, comprising:
receiving the light beam arriving from the secondary image;
detecting a lateral displacement of the secondary image on the basis of the beam receiving result; and
detecting the position of the surface on the basis of the lateral displacement of the secondary image.

20. An exposure method which exposes a substrate to exposure light, the method comprising:
holding the substrate by a holder; and
detecting a position of a surface of the substrate held by the holder by use of the surface position detection method according to claim 13.

21. The exposure method according to claim 20, comprising driving the holder on the basis of a detection result obtained by using the surface position detection method to change at least one of a position of the substrate held by the holder with respect to a direction crossing the substrate and an inclination of the substrate held by the holder.

22. The exposure method according to claim 20, comprising:
forming a pattern image onto the surface of the substrate held by the holder by projecting the exposure light by use of a projection optical system;
driving the holder on the basis of a detection result obtained by using the surface position detection method to change at least one of a position of the substrate held by the holder with respect to a direction parallel to an optical axis of the projection optical system and an inclination of the substrate held by the holder with respect to the optical axis,
wherein the exposure light is projected onto the surface of the substrate of which the at least one of the position with respect to the direction parallel to the optical axis and the inclination with respect to the optical axis has changed on the basis of the detection result.

23. The exposure method according to claim 22, wherein the holder is driven such that the surface of the substrate is located within a focal depth of the projection optical system.

24. A device manufacturing method of manufacturing a device having a circuit pattern, the method comprising;
exposing a substrate to exposure light by using the exposure apparatus according to claim 1; and
developing the substrate having exposed to the exposure light.

25. A device manufacturing method of manufacturing a device having a circuit pattern, the method comprising;
exposing a substrate to exposure light by using the exposure method according to claim 20; and
developing the substrate having exposed to the exposure light.

* * * * *